(12) United States Patent
Renaud

(10) Patent No.: US 8,390,091 B2
(45) Date of Patent: Mar. 5, 2013

(54) SEMICONDUCTOR STRUCTURE, AN INTEGRATED CIRCUIT INCLUDING A SEMICONDUCTOR STRUCTURE AND A METHOD FOR MANUFACTURING A SEMICONDUCTOR STRUCTURE

(75) Inventor: Philippe Renaud, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 15 days.

(21) Appl. No.: 13/143,548

(22) PCT Filed: Feb. 3, 2009

(86) PCT No.: PCT/IB2009/051306
§ 371 (c)(1),
(2), (4) Date: Jul. 7, 2011

(87) PCT Pub. No.: WO2010/089632
PCT Pub. Date: Aug. 12, 2010

(65) Prior Publication Data
US 2011/0278598 A1    Nov. 17, 2011

(51) Int. Cl.
*H01L 29/47*    (2006.01)
(52) U.S. Cl. ............... 257/471; 257/472; 257/E29.246; 257/E29.148; 438/92
(58) Field of Classification Search .............. 438/92; 257/77, 192, 194, 260, 267, 471, 472, E27.068, 257/E29.148, E29.149, E29.246, E21.403
See application file for complete search history.

(56) References Cited

U.S. PATENT DOCUMENTS

| 7,084,475 | B2 | 8/2006 | Shelton et al. |
| 2006/0175633 | A1 | 8/2006 | Kinzer |
| 2007/0045765 | A1 | 3/2007 | Brar et al. |
| 2007/0205433 | A1* | 9/2007 | Parikh et al. ................. 257/192 |
| 2008/0105902 | A1 | 5/2008 | Twynam |
| 2010/0019279 | A1* | 1/2010 | Chen et al. .................... 257/194 |

FOREIGN PATENT DOCUMENTS

EP    1109266 A    6/2001

OTHER PUBLICATIONS

Ikeda Nariaki et al: "High Power AlGaN/GaN HFET with a High Breakdown Voltage of Over 1.8 kV on 4 inch Si Substrates and the Suppression of Current Collapse" Proceedings of the 20th International Symposium on Power Semiconductor Devices & IC's, May 18-22, 2008 Oralando, FL, pp. 287-290.

Dang Gerard T et al: "High Voltage GaN Schottky Rectifiers" IEEE Transactions on Electron Devices, vol. 47, No. 4, Apr. 2000, pp. 692-696.

Johnson J W et al: "Breakdown Voltage and Reverse Recovery Characteristics of Free-Standing GaN Schottky Rectifiers" IEEE Transactions on Electron Devices, vol. 49, No. 1, Jan. 2002, pp. 32-36.

International Search Report and Written Opinion correlating to PCT/IB2009/051306 dated Oct. 16, 2009.

\* cited by examiner

*Primary Examiner* — Brook Kebede

(57) ABSTRACT

A monolithic semiconductor structure includes a stack of layers. The stack includes a substrate; a first layer made from a first semiconductor material; and a second layer made from a second semiconductor material. The first layer is situated between the substrate and the second layer and at least one of the first semiconductor material and the second semiconductor material contains a III-nitride material. The structure includes a power transistor, including a body formed in the stack of layers; a first power terminal at a side of the first layer facing the second layer; a second power terminal at least partly formed in the substrate; and a gate structure for controlling the propagation through the body of electric signals between the first power terminal and the second power terminal. The structure further includes a vertical Schottky diode, including: an anode; a cathode including the substrate, and a Schottky barrier between the cathode and the anode, the Schottky barrier being situated between the substrate and a anode layer in the stack of layers.

18 Claims, 3 Drawing Sheets

SEMICONDUCTOR STRUCTURE, AN INTEGRATED CIRCUIT INCLUDING A SEMICONDUCTOR STRUCTURE AND A METHOD FOR MANUFACTURING A SEMICONDUCTOR STRUCTURE

FIELD OF THE INVENTION

This invention relates to a semiconductor structure, an integrated circuit including a semiconductor structure and a method for manufacturing a semiconductor structure.

BACKGROUND OF THE INVENTION

III-nitride based power transistors are known in the art. III-nitride power semiconductor devices are used for power applications, for example to supply power, due to their high breakdown voltage and low on-resistance. However, a disadvantage of the known III-nitride power semiconductor devices is that they are discrete devices which need to be connected to other electronic components in order to form an electronic circuit. Accordingly, the resulting circuit is composed of several dies connected to each other and therefore has a relatively large footprint and is relatively complex to manufacture.

United States Patent Application Publication US 2006/0175633 discloses a monolithic integrated III-nitride power device which includes a hetero-junction III-nitride body having a first III-nitride semiconductor layer and a second III-nitride semiconductor layer having a band gap different from that of the first III-nitride layer disposed over the first III-nitride layer. A first power electrode is electrically connected to the second III-nitride layer, as well as a second power electrode. A gate structure is disposed over the second III-nitride layer between the first power electrode and the second power electrode, and a Schottky electrode is present which is in Schottky contact with the second III-nitride layer.

However, it is implied in this publication that the second III-nitride semiconducting layer is undoped, and thus has the intrinsic electrical properties of the III-nitride used, since a high resistivity of the second III-nitride semiconducting layer is required for a hetero-junction. However, such an intrinsic layer is not suited for a Schottky diode, which requires a low current resistance in the forward bias condition.

Accordingly, to obtain a properly working power device, the monolithic integrated III-nitride power device disclosed in US 2006/0175633 has to be modified to provide a conducting region in the second III-nitride semiconducting layer in the region of the Schottky diode, i.e. by doping.

SUMMARY OF THE INVENTION

The present invention provides a semiconductor structure, an integrated circuit including a semiconductor structure and a method for manufacturing a semiconductor structure as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Figure 1:
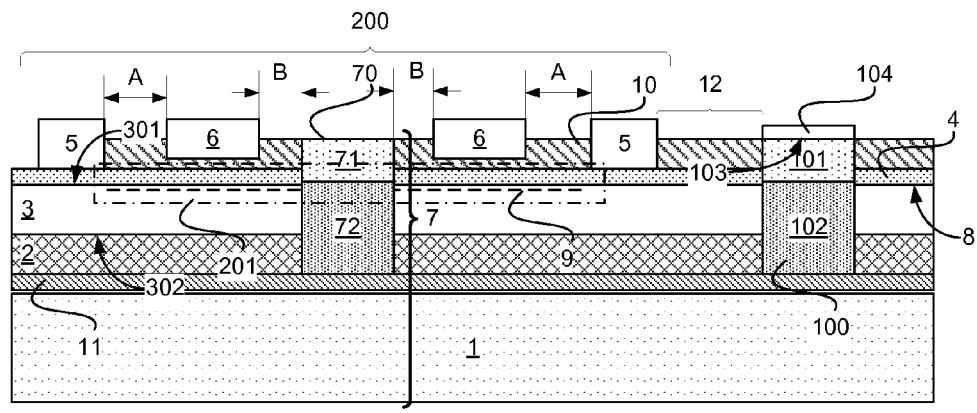
FIG. 1 schematically shows a cross-sectional view of a first example of an embodiment of a monolithic semiconductor structure.

Referring to FIG. 1 an example of a monolithic semiconductor structure is shown therein. The monolithic semiconductor structure includes a stack of layers. The shown stack of layers comprises a substrate 1, a first layer 3 made from a first semiconductor material and a second layer 4 made from a second semiconductor material. One or more of the first semiconductor material and the second semiconductor material may contain a III-nitride material. The first layer 3 is situated between the substrate 1 and the second layer 4 and more in particular in this example is positioned directly adjacent and in direct contact with the second layer 4 at a second layer side 301 of the first layer 3. Although the first layer 3 may be situated directly adjacent and in direct contact with the substrate 1 at a substrate side 302 of the first layer 3, in the shown example the first layer 3 is separated from the substrate 1 by one or more intermediate layers 2,11.

The structure includes a power transistor 200. The power transistor 200 may be any suitable type of power transistor. The power transistor 200 may for example be a hetero-structure field effect transistor (HFET), which may also be referred to as a high electron mobility transistor (HEMT), as explained in more detail below. The HFET may for example be implemented as a high power switch which can control currents at high voltages, for example at voltages of 50 V or more and/or 1500 V of less.

As shown in FIG. 1, the power transistor 200 includes a body 201 formed in the stack of layers. A first power terminal 5 of the power transistor 200 is present at the second layer side 301, which faces the second layer 4, of the first layer 3. A second power terminal 7 of the power transistor 200 is, at least partly, formed in the substrate 1. The power transistor 200 further includes a gate structure 6, for controlling the propagation, through the body, of electric signals between the first power terminal 5 and the second power terminal 7.

In the shown example, the distance A between the gate structure 6 and the first power terminal 5 is (much) more than the distance B between the gate structure 6 and the second power terminal 7. For example, the distance between the gate structure 6 and the first power terminal 5, in this example the drain of the power transistor, may be more than 10 micrometer, such as 15 micrometer or more, for example between 15 and 20 micrometer and the distance between the gate structure 6 and the second power terminal 7, e.g. in this example the source of the power transistor, may be 10 micrometer or less, such as about 2 micrometer or less. A higher voltage difference may be applied between the gate structure 6 and the first power terminal 5 than between the gate structure 6 and the second power terminal 7. The voltage difference between the gate structure 6 and the first power terminal 5 may be 1500 V or less, for example several hundreds of volts or less, such as 600 V or less, whereas the voltage difference between the gate structure 6 and the second power terminal 7, e.g. the source in this example, may be 30 V or less, such as 10 V or less.

Figure 2:
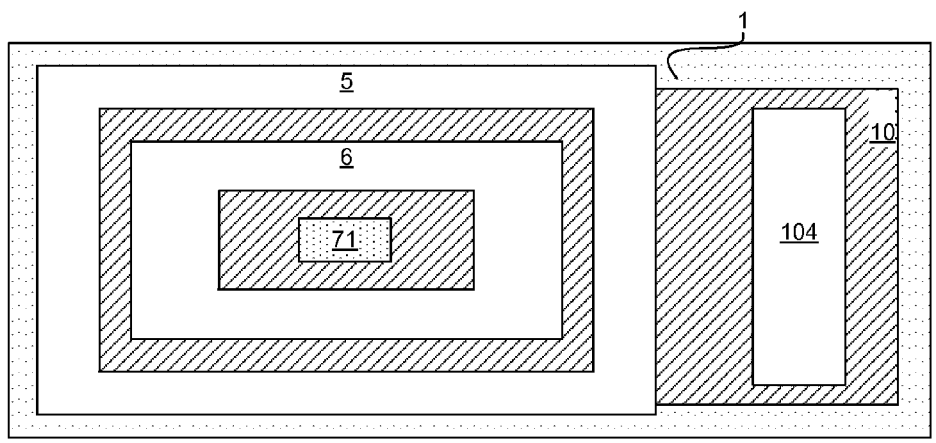
FIG. 2 schematically shows a top view of the example of FIG. 1.

The power terminals 5, 7 and the gate structure may have any shape suitable for the specific specification. In the example shown in FIGS. 1 and 2, the first power terminal 5 is a loop which encloses the gate structure 6 and the second power terminal 7, whereas the gate structure is a loop (enclosed by the first power terminal 5) which encloses the second power terminal 7. As shown in FIG. 2, the loops may be closed loops, however the loops may alternatively be open or be interrupted for instance for trace route conducting lines to pass through. Furthermore, in the example of FIGS. 1 and 2, the loops are rectangular; however it will be apparent that other shapes, such as hexagonal, circular or elliptical may be used as well. Also, in the examples the loops and the second power terminal are concentric, and the configuration has a 180 degrees rotational symmetry. However it is also possible that the gate structure and/or the second power terminal are positioned eccentric with respect to the first power terminal and that the configuration is asymmetric or symmetric in another manner, e.g. mirror symmetric or otherwise.

As shown in FIG. 1, the monolithic semiconductor structure may further include a Schottky diode, in this example implemented as a vertical Schottky diode 100. The vertical Schottky diode 100 includes an anode 104 and a cathode which includes the substrate.

A Schottky barrier 103 is present between the cathode and the anode 104. The Schottky barrier 103 is situated between the substrate 1 and an anode layer in the stack of layers, in which the anode 104 is formed. In the example, the Schottky barrier 103 a metal-semiconductor interface extending in a lateral direction, i.e. parallel to the substrate layer 1, between the anode layer and a part of a semiconductor layer 101 which is included in the cathode. In the example, the anode layer is a top layer of the stack of layers, formed from a metallic material and the Schottky barrier 103 is level with the exposed surface of a dielectric layer 10, which in a vertical direction (from the substrate towards the top layer) lies below the anode layer. However, it will be apparent that the Schottky barrier may be situated at another position in the stack of layers, and for example be below the surface of the dielectric layer 10, for example when the anode layer is partially recessed in the layers below the top layer.

The cathode may extend through at least a part of the first layer 3 and/or the second layer 4, and, as shown in FIG. 1, may include a recess which extends through the layers 3, 4 and is filled with one or more diode layers 101, 102 of suitable materials. As shown, the recess may extend to an intermediate layer 11 situated between the substrate 1 and the second layer 4, and be in direct contact with the intermediate layer 11. The intermediate layer 11 may provide for an electrical path between the recess and the substrate 1. As shown in the example, the intermediate layer 11 may for example be a conducting layer in direct contact with the substrate 1. However, alternatively the recess may extend to the substrate 1, e.g. through any intermediate layers between the layers 3,4 and the substrate 1, and the material filling the recess may be in direct contact with the substrate 1, The cathode 103 includes the substrate 1 and the Schottky barrier is situated between the substrate and the anode layer in the stack of layers. Thus, the Schottky diode can be manufactured in the same steps as the parts of the transistor 200 situated in the stack of layers. More in particular, as explained below in more detail, the vertical Schottky diode 100 may for example be manufactured simultaneously with the second power terminal 7.

Figure 7:
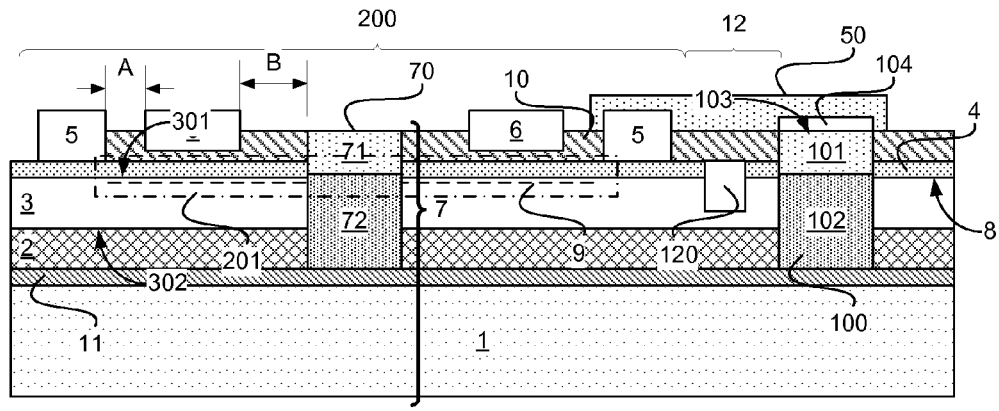
FIG. 7 schematically shows a equivalent circuit diagram of the example of FIG. 1.

As can be seen in FIGS. 1 and 2, an insulating region 12 may be present between the semiconductor region and the body which electrically isolates the semiconductor region of the cathode from the body of the transistor. In the insulating region 12 at least the second layer 4 may be made of a not intentionally doped semiconductor material, thereby obtaining a highly resistive area, whereas in areas where a good conductivity is desired the second layer 4 may be doped. As shown in FIG. 7, the insulting region 12 may be formed by an isolating trench 120, for example by locally removing (in a part of the insulating region) the layer 4 completely and layer 3 partially and filling with a suitable dielectric the recess thus formed in the insulating region 12. However, in addition or alternatively, the isolation between the power transistor and Schottky diode may be implemented using other suitable isolation techniques, such as a junction isolation, a dielectric isolation, or an impurity implanted isolation such as oxygen implantation.

Figure 3:
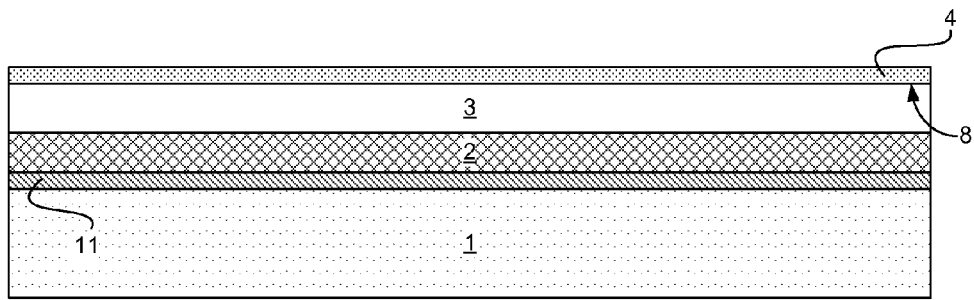
FIGS. 3-6 schematically shows cross-sectional views of an example of an embodiment a monolithic semiconductor structure in successive stages of an example of a method of manufacturing thereof.

Referring to FIGS. 3-6, the monolithic semiconductor structure may for example be manufactured with a method for manufacturing a monolithic semiconductor structure, which includes providing a stack of layers. As shown in FIG. 3, the stack may include: a substrate 1; a first layer 3 made from a first semiconductor material; and a second layer 4 made from a second semiconductor material. The stack of layers may include additional layers, such as intermediate layers 2,11, dielectric layer 10, an anode layer or other suitable layers. The layers of the stack may be provided before the transistor and/or the Schottky diode are provided. However, alternatively one or more layers of the stack may be provided during or after providing the transistor 200 and/or the Schottky diode 100.

The substrate 1 may be conductive and provide an electrical path, e.g. as shown in FIG. 1 to the source of the transistor 200 (or as shown in FIG. 7 to the drain of the transistor 200) and/or to the cathode 102 of the Schottky diode 100. The substrate 1 may for example be Ohmic. The substrate 1 may be made from a substrate semiconductor material containing mono-crystalline silicon or another suitable substrate material. The substrate 1 may for example be a semiconductor doped to enhance the substrate conductivity, e.g. in case of a (mono-crystalline) silicon layer the substrate 1 may be provided with a n-type doping, such as arsenic, phosphorus or another suitable type of dopant.

The first layer 3 and the second layer 4 may be implemented in any manner suitable for the specific implementation. One or more of the first semiconductor material and the second semiconductor material may contain a III-nitride material, such as (alloys, compounds or mixtures of) a nitride of Al and/or In and/or Ga. It has been found that III-nitride materials are suitable for both the power transistor and the Schottky diode, and as explained below in more detail allow the manufacturing of the Schottky diode without additional steps. The III-nitride material or materials used may for example be one or more materials in the group consisting of: binary III-nitride material, ternary III-nitride material, quaternary III-nitride material, GaN, AlGaN (for example having an Al concentration of 20% or more and/or 30% or less), InGaN, AlInN, AlInGaN, and epitaxial grown III-nitride material. A first layer 3 of GaN and a second layer 4 of AlGaN have been found to be a combination of materials suitable for both a HEMT and a Schottky diode. The first layer 3 may for example have a thickness of at least 1 micrometer, and as much as 6 micrometers.

The first layer 3 and the second layer 4 may for example be implemented in a manner suitable to form a hetero-junction. As shown in FIG. 3, the first layer 3 and the second layer 4 may be provided such that an interface 8 is obtained at which the first layer 3 and the second layer 4 are in contact with each other. Along the interface 8, when the power transistor is in operation, a two dimensional electron gas (2DEG) 9 may be formed in a part of the first layer 3 directly adjacent to the interface 8. It will be understood that the term 'two dimensional electron gas' as used in this application, this includes a gas of electrons able to move in two dimensions, but tightly confined in the third dimension, as well a similar gas of holes. As shown in the FIGs, the layers 3, 4 and the interface 8 may be substantially planar and be oriented parallel to a top surface of a wafer (which in the shown FIGs. is formed by the top surface of the substrate 1). The wafer may, as shown, be of a mono-layer substrate. However alternatively, the wafer may be of a multi-layer substrate.

The first semiconductor material and the second semiconductor material used may for example be selected from materials suitable for a hetero-junction. The second semiconductor material may for example have a band-gap different from a band-gap of the first semiconductor material. Thereby, the bandgaps at the interface 8 will bend, as is generally known in the art, and a potential well may be obtained in which the 2DEG 9 can be formed. The first layer 3 may for example be made from a not intentionally doped semiconductor material. Thereby, the first layer 3 can be provided with a high resistivity and the leakage current of the HFET in the off-state may be reduced. Without wishing to be bound to any theory, it is believed that the high resistivity confines the electrons of the 2DEG 9 within a sheet shaped region of the first layer 3 at the interface 8 thus inhibiting a leakage through parts of the first layer 3 which are remote from the interface 8. In addition, the 2DEG can provide a high sheet carrier density (for example as high as $8.10^{12}$ cm$^{-2}$ or more) and may have a high electron mobility (for example in the range of $10^3 \cdot$cm$^2$/V or more). Furthermore, the 2DEG can have a low on-state resistance, for example a resistance as low as 3 m·OhmCm$^2$ or less may be obtained. The first layer 3 may for example have a thickness of 1 micrometers or more, such as 2 micrometers or more, and/or 10 micrometers or less, such as between 2-6 μm. The second layer 4 may for example have a thickness of less than 0.1 micrometer, such as several tenths of nanometers, such as 20 nm to 30 nm.

The second layer 4 may for example be implemented as a tunnelling layer which, after manufacturing of the structure, separates the first power terminal 5 from the first layer 3 and which, when the transistor is operated after manufacturing of the semiconductor structure, allows a conduction between the first power terminal 5 and the 2DEG 9 via tunnelling of charge carriers through the second layer 4. For example, the second layer 4 may be an AlGAN layer between the power terminal 5 and the first layer 3 which has a thickness of about 300 Angstrom. The AlGaN layer having aluminium composition for example between 20% and 30%. It should be apparent that other layers may be present. Alternatively, as shown in the examples, the first power terminal 5 may also be in direct contact with the 2DEG 9 and for example be provided in the second layer 4 which extends to at least the top surface of the first layer 3 or into the first layer 3 (for example by locally etching a recess in the second layer 4 to a desired depth and thereafter depositing the terminal layer(s) or/and by thermal diffusion of a suitable material, e.g. dopant, in the second layer 4). Alternatively, the first power terminal 5 may also be in contact with the 2DEG 9 through a conductive path made by local thermal diffusion of metal and/or residual doping in the second layer 4 in order to make the second layer 4 electrically conducting in the area of the conductive path. The conductive path may also be provided in another way, such as by dopant implant followed by thermal diffusion in the area of the conductive path, for example by an implantation and subsequent activation.

It should be noted that the 2DEG 9 may also be formed using other mechanisms and that other (combinations of) materials may be used to form the heterojunction. The second semiconductor material may for example have a lattice constant different from a lattice constant of the first semiconductor material, and the first semiconductor material may exhibit a piezoelectric polarization in a transversal direction from the interface towards the substrate. Thereby, due to the different lattice constant, the first semiconductor material will be stressed or strained and the first layer 3 will be charged at the interface 8. Thereby, the density of electrons at the interface 8 may be increased.

As shown in e.g. FIG. 3, the stack of layers may include additional layers such as a nucleation layer 11. As shown, the nucleation layer 11 may be directly adjacent and in contact with the substrate 1 and act as a base layer for epitaxial layers grown on the nucleation layer and which e.g. may have a crystal structure and lattice constant which allows a growth of the epitaxial layers thereon. In addition, the nucleation layer 11 may serve to compensate for a mismatch between the crystal structure and/or lattice constant of the substrate 1 and the crystal structure and/or lattice constant of the layers grown on the nucleation layer 11. For example, the first layer 3 and second layer 4 may be epitaxial layers grown using a suitable epitaxial process.

The nucleation layer 11 may e.g. be of a conductive material or provide otherwise an electrical connection to conductive parts (such as the anode 101 and/or the second power terminal 7) above the nucleation layer 11, e.g. via tunnelling of electrons through the nucleation layer. The nucleation layer 11 may for example be made electrically conducting by the diffusion of elements from the substrate 1 into the nucleation layer 11 during growth of the nucleation layer and/or due to a disordered orientation of the crystals of the nucleation layer 11, e.g. the nucleation layer may be polycrystalline. The layers grown on the nucleation layer 11, such as the transition layer 2 or the first semiconductor layer 3 may be mono-crystalline or less disordered and/or contain less or no elements from the substrate and accordingly be highly resistive.

The nucleation layer 11 may for example be less than 100 nm thick, such as for example be 50 nm or less. A suitable thickness, e.g. for an AlN nucleation layer on a substrate (such as on a monocrystalline substrate layer), is found to be between 35 nm and 45 nm, such as 40 nm.

The stack of layers as shown in FIG. 3 may further include, for example, a transition layer 2 provided between the first layer 3 and the substrate 1. The transition layer 2 serves to gradually improve the crystal quality of the material grown by epitaxy to enable the first layer 3 to be a monocrystal with a low dislocation density (as low a $5.10^9$ cm$^{-2}$). In addition, the transition layer 2 may also participate to electrically isolate the layers above the transition layer 2 from the substrate 1. In the shown example, the transition layer 2 is grown on the nucleation layer 11. The transition layer 2 may for example be an epitaxial layer. A suitable composition for the transition layer 2 has been found to be alternate layers of GaN/AlN. Also, the transition layer may be made of AlGaN with a graded Al composition, for example from AlN (i.e. no Ga added) to GaN (i.e. no Al added) in a direction from the substrate to the second layer 4. The transition layer 2, or some sub-layers thereof, may be doped to increase their resistivity or create p-type regions, for example with Fe; Mg or C or components or alloys, compounds or mixtures thereof.

A power transistor 200 may be provided in the stack. The process of providing the power transistor may overlap for some parts with the process of providing the stack of layers. In the example illustrated in FIGS. 3-6, the power transistor 200 is provided after the first and second layers 3,4 have been provided, but overlaps with the provision of other layers, e.g. dielectric layer 10, anode layer 104. In this example, the transistor body 201 is defined in the stack of layers by the position of the power terminal 5, and a channel 70 which is part of the second power terminal 7 and provides an electrically conducting path between a second power terminal side of the transistor body 201 and the substrate 1. In this example, the body 201 includes a hetero-junction structure which includes the interface 8 at which the first layer 3 and the second layer 4 are in contact with each other and along which interface 8, when in operation, the 2DEG is formed.

Figure 4:
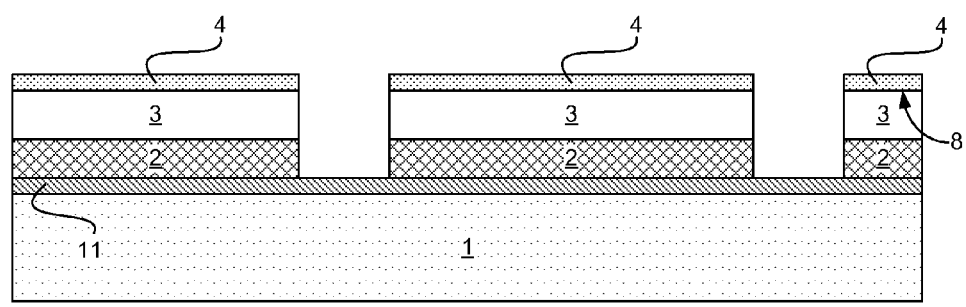

As illustrated in FIGS. 3 and 4, for example, a second power terminal 7 may be provided at least partly in the substrate 1. The second power terminal 7 may for example include the channel 70, for example a semiconducting or metallic channel. The channel 70 may for example be provided by locally removing a part of the stack of layers, in order to obtain an recess through at least the first and second layers 3,4, for example using plasma etching. The recess may for example extend from an exposed surface of the stack to the nucleation layer 11 or to the substrate 1.

Figure 5:
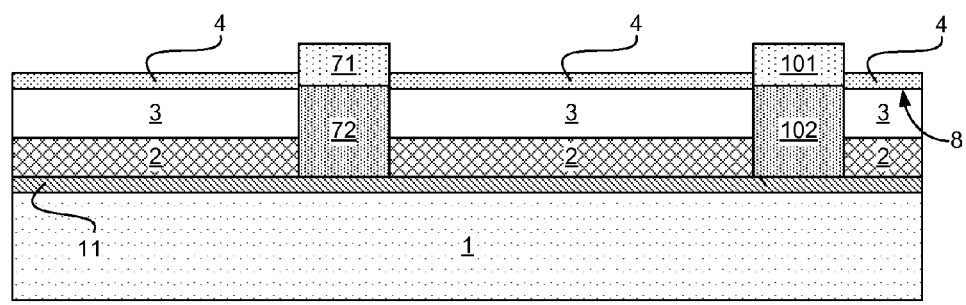

As shown in FIG. 5, the recess may then be filled with a suitable material, such as a doped semiconductor material, in order to provide an electrical path between the body 201 and the substrate 1. The recess may be completely filled with a suitably doped semiconductor layer, such as n-doped GaN. The recess may for instance be filled with a doped material, e.g. an n-type doping, to be highly conductive, while the second layer 4 may be non-intentionally doped. Thereby the leakage current when the gate terminal is biased e.g. at a negative voltage of for example −5V or less, may be reduced.

In the example of FIG. 5, the recess is partially filled with a conducting layer 72 which is in direct contact with a surface of the stack of layers exposed in the recess in this phase of the processing is, e.g. in this example nucleation layer 11. Alternatively, when the recess extends through the nucleation layer 11 or when the nucleation layer 11 is not present, the exposed surface may be of the substrate 1. The layer 72 may for example be a doped semiconductor layer, for example a III-nitride material, such as n-doped GaN and for example be grown by epitaxial regrowth, for example using Molecular beam epitaxy (MBE), e.g. in case of vertical regrowth, or Metal-Organic-Chemical-Vaport-Epitaxy (MOCVD), e.g. in case of both vertical and lateral regrowth). After growing the first conducting layer 72, the recess may then be filled completely by one or more additional layers. For example, the recess may then, as shown in FIG. 5, be filled completely by growing another layer 71, made of a semiconductor material or of a metallic material. In case the layer 71 is made of a semiconductor material, the layer 72 may be made of the same type of material but with a different concentration of dopants. For instance, the layers 72,71 may both be made of n-type doped GaN, e.g. obtained by epitaxial regrowth, the lower layer 72 having a higher (N+) concentration than the concentration (N−) of the doping in the top layer 71. For example, the lower layer may have a concentration which is several orders of magnitude higher than the concentration in the top layer. Suitable values have for example found to be a doping concentration of $10^{19} Cm^{-3}$ in the lower layer and a doping concentration of $10^{16} Cm^{-3}$ in the top layer 71.

Figure 6:
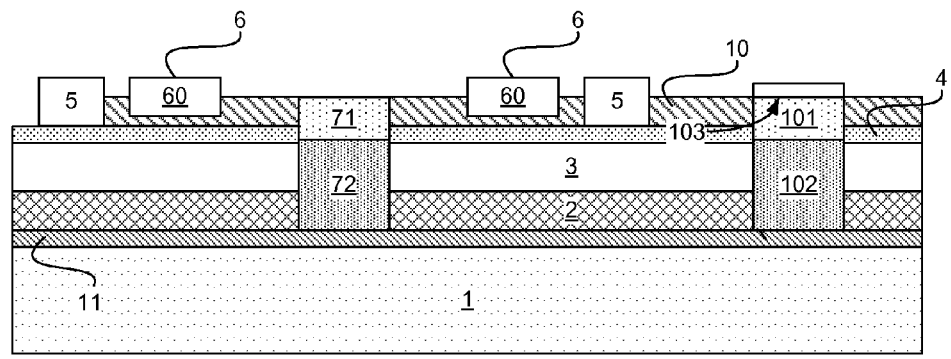

As illustrated in FIG. 6, e.g. after forming the second power terminal 7, a first power terminal 5 may be formed at a side of the first layer 3 facing the second layer 4. As explained above, the first power terminal 5 may for example be separated from the first layer 3 by the second layer 4 or be provided in direct contact with the first layer 3, e.g. by etching the second layer 4 and subsequent growth of a suitable material in the thus formed recess. The first power terminal may for example be made of a metal or other suitable conducting material, such as a stack of layers of Al/Ti, Ni/Al/Ti, Mo/Al/Ti or the like. The first power terminal 5 may for example be provided by locally etching the second layer 4 to a suitable depth, e.g. to the first layer 3, in order to obtain a recess which is in direct contact with the 2DEG 9. Subsequently, a suitable material, e.g. a metal, may be grown in the recess. Alternatively, as shown in FIG. 6, the first power terminal 5 may be obtained by locally growing a conducting material on the second layer 4, which is electrically, but indirectly, in contact with the 2DEG 9, for example by a tunnelling path through the second layer 4. Also, the first power terminal 5 may be obtained by locally diffusing, e.g. thermally, or otherwise insert elements in the first layer 3 and/or second layer 4. Thereafter the intermediate product for the semiconductor structure may be subjected to a rapid thermal anneal to built ohmic terminals with low contact resistance.

Before, during or after the formation of the first power terminal, a gate structure 6 may be formed, which can control the propagation through the body of electric signals between the first power terminal 5 and the second power terminal 7.

The gate structure 6 may be implemented in any manner suitable for the specific implementation. As shown, the gate structure may be provided at a side of the second layer 4 opposite to an interface side at which the second layer 4 is in contact with the first layer 3. In the examples, the gate structure 6 includes a patterned gate layer 60 which is separated from the second layer 4 by a dielectric layer 10. The gate layer 60 may for example be made of a conducting material, including for example a metal, such as a chemical compound or alloy including Au, Ti, Al, Ag, Cr, W, Pt, Ni, Pa or In, or a semiconductor material, such as poly-silicon, optionally provided with a suitable doping. The dielectric layer 10 may for example made from silicon nitride or silicon-oxide or tantalum oxide, for example be made of $Si_3N_4$, $SiO_2$, $Ta_2O_5$ or other suitable type of isolator.

The gate layer 60 may be in capacitive contact with the second layer 4 and/or the first layer 3. Alternatively, the gate layer 60 may be in direct contact with the second layer 4 or the first layer 3 to form a Schottky type potential barrier. In such case, the gate layer 60 may be a multi-layer structure. The multi-layer structure may for example include two or more metal layers, such as a Ti/Au; Ti/Al or Ni/Au, Ni/Al or Pt/Ti/Au, Pt/Al, Ir/Au, Ir/Al or Pt/Au, Pt/Al multilayer.

The gate structure 6 may for example be provided by depositing a dielectric layer 10 on the exposed surface of the stack of layers and locally etching the dielectric layer 10 to a certain depth, e.g. to the second layer 4 in case of a direct contact gate structure, or to a depth less than the thickness of the dielectic layer 10 in case of a capacitive contact. As shown, in the thus obtained recess, the gate layer 60 may be deposited. As shown, the thickness of the gate layer 60 may exceed the depth of the recess. The dielectric layer may for example include a passivation layer and/or other elements or layers Simultaneously with the power transistor 200, a vertical Schottky diode 100 may be provided. As explained below in more detail, the forming of the vertical Schottky diode may include: forming an anode which extends through at least a part of the first layer and/or the second layer; forming a cathode including the substrate, and forming a Schottky barrier between the cathode and the anode.

As illustrated in FIGS. 3 and 4, for example, the vertical Schottky diode may for example be provided by removing, simultaneously with the formation of a recess for the second power terminal 7, locally a part of the stack of layers to obtain a recess through at least the first and second layers 3,4, for example using plasma etching. The recess may for example extend from a top surface of the stack to the nucleation layer 11 or to the substrate 1. As shown in FIG. 5, the recess may then be filled with a suitable anode semiconductor material similar to, and at the same time as, that of the recess in which the second power terminal 7 is formed, such as a doped semiconductor material, in order to form (a part of) the cathode of the Schottky diode 100. The recess may, for example, be completely filled with a suitably anode semiconductor material, such as a doped semiconductor layer, such as n-doped GaN, to extend the cathode into the recess. The top surface of the semiconductor layer may be covered with a metal layer which forms the anode 104, in which case the Schottky barrier can be situated between the semiconductor layer and the metal layer.

In FIG. 5, the recess is partially filled with a semiconductor layer 102 which is in direct contact with an surface of the stack of layers exposed in the recess, e.g. in this example nucleation layer 11. Alternatively, when the recess extends through the nucleation layer or when the nucleation layer is not present, in which case the exposed surface may be of the substrate 1. The semiconductor layer conducting layer 102 may for example be a doped semiconductor layer, such as n-doped GaN and for example be grown by epitaxial regrowth using Molecular beam epitaxy (vertical regrowth) or Metal-Organic-Chemical-Vapor-Epitaxy (lateral and vertical regrowth).

After growing the semiconductor layer 102, the recess may then be filled completely by one or more additional layers. For example, the recess may then, as shown in FIG. 5, be filled completely by growing another layer 101, made of a semiconductor material or a metallic material, for example a III-nitride material, such as doped GaN. In case the layer 101 is metallic, the Schottky barrier will be situated between the layers 101,102 and the layer 101 is then part of the anode. As shown in FIG. 6, in case the layer 101 is a semiconductor layer, the Schottky barrier can be obtained by depositing on the exposed surface of layer 101 a metallic layer with a shape and size suitable to form the anode. The metallic layer may for example be the same as the gate layer 60, and be patterned in the anode 104 above the recess.

In case the layer 101 is made of a semiconductor material, the layer 102 may be made of the same type of material but with a different concentration of dopants. For instance, the conducting layer 101 and the semiconductor layer 102 may both be made of n-type doped GaN, e.g. obtained by epitaxial regrowth, the conducting layer 102 having a higher (N+) concentration than the semiconductor layer 101 (indicated as N-). For example the lower layer may have a concentration which is several orders of magnitude higher than the concentration in the top layer 101. Suitable values have for example found to be a doping concentration of $10^{19}$ $Cm^{-3}$ in the lower layer 102 and a doping concentration of $10^{16}$ $Cm^{-3}$ in the top layer 101. The doping concentrations of layers 102 and 101 determine the vertical breakdown voltage and current resistance of the Schottky diode. For example a breakdown voltage of 600V or more, for example up to 1500V, and current resistance of few milli-Ohms or less may be obtained.

Figure 8:
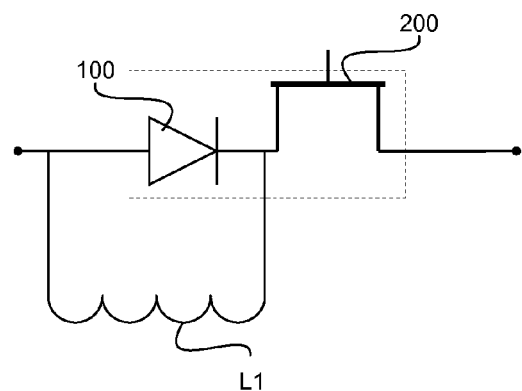

Referring to FIG. 8, an equivalent circuit of the example of a semiconductor structure is shown. As shown, the equivalent circuit includes a power transistor 200 connected in series with a diode 100. More specific, the cathode of the diode is connected to the source of the power transistor. The drain of the power transistor 100 may for instance be connected to a ground or a positive potential, while the source may, e.g., be connected to a negative potential or to a ground. As shown in FIG. 7, an inductance L1 may be connected, in parallel to the diode, to the source of the power transistor. The diode 100 may then be used as a flyback diode which inhibits the flyback current caused by the inductance when the power transistor 200 is switched off, i.e. the current flow through the power transistor 200 is interrupted. It will be apparent that the semiconductor structure may also be used in other applications, and that the shown circuit is just an example. The circuit may for example be implemented as an integrated circuit, for example by providing the inductance L1 and the semiconductor structure in the same integrated circuit package or by providing the inductance L1 and the semiconductor structure on the same die.

In the example of FIGS. 3-6, the second power terminal may be the source of the transistor, and the first power terminal the drain and as explained above the distance between the second power terminal 7 and the gate 6 may be less than the distance between the first power terminal 5 and gate 6.

Figure 9:
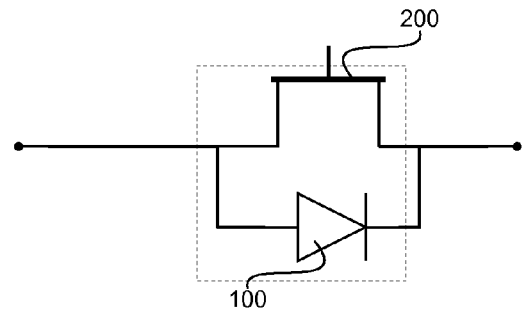

Referring to FIGS. 7 and 9, alternatively, the first power terminal 5 may be the source, while the second power terminal 7 may be the drain. The distance A between the first power terminal 5 and the gate 6 may then be less than the distance B between the second power terminal 7 and gate 6. The distance between the gate structure 6 and the first power terminal 5 may for example be 10 micrometer or less, such as about 2 micrometer or less and the distance between the gate structure 6 and the second power terminal 7, e.g. in this example the source of the power transistor, may be more than 10 micrometer, such as 15 micrometer or more. The voltage difference between the gate structure 6 and the first power terminal 5 may then may be 30 V or less, such as 10 V or less, whereas the voltage difference between the gate structure 6 and the second power terminal 7 terminal may be several hundreds of volts, such as 1500 V or less, such as 600 V or less.

As shown, in case the second power terminal forms the drain, the anode of the Schottky diode 100 may be electrically connected to the source, i.e. the first power terminal 5. Thereby, the Schottky diode 100 may be used as a clamp diode which clamps the drain and source of the transistor 200. For example, a conducting path, e.g. a metal line, may be provided which connects the anode layer to the first power terminal 5. The conducting path may for example be provided as a patterned layer 50 deposited on the dielectric layer 10, which extends between, and is in direct contact with, the first power terminal 5 and the anode 104.

Referring to FIG. 9, an equivalent circuit of the example of FIG. 7 is shown. As shown, the equivalent circuit includes a power transistor 200 connected in parallel with a diode 100. More specific, the cathode of the diode is connected to the drain of the power transistor and the anode is connected to the source. The drain of the power transistor 100 may for instance be connected to a positive potential, while the source may, e.g., be connected to a ground. The diode 100 may then be used as a clamp diode to evacuate any voltage/current surge when the power transistor 200 is switched off, i.e. the current flow through the power transistor 200 is interrupted.

In the foregoing specification, the invention has been described with reference to specific examples of embodiments of the invention. It will, however, be evident that various modifications and changes may be made therein without departing from the broader spirit and scope of the invention as set forth in the appended claims. For example, the transistor may be part of an integrated circuit which includes one or more transistors. Also, although in the FIGs. cross-sectional views are shown, it will be apparent that the transistor may for example have a circular, hexagonal or rectangular shape. Also, for instance, the substrate isolation could also be performed using a pn junction isolation.

For example, the semiconductor substrate described herein can be any semiconductor material or combinations of materials, such as silicon carbide, gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections.

Although specific conductivity types or polarity of potentials have been described in the examples, it will be appreciated that conductivity types and polarities of potentials may be reversed.

However, other modifications, variations and alternatives are also possible. The specifications and drawings are, accordingly, to be regarded in an illustrative rather than in a restrictive sense. In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. A monolithic semiconductor structure, including;
    a stack of layers including:
        a substrate;
        a first layer made from a first semiconductor material; and
        a second layer made from a second semiconductor material, said first layer being situated between the substrate and the second layer and at least one of said first semiconductor material and said second semiconductor material containing a III-nitride material;
    said structure including a power transistor, including:
        a body formed in said stack of layers;
        a first power terminal at a side of said first layer facing said second layer;
        a second power terminal at least partly formed in said substrate; and
        a gate structure for controlling the propagation through said body of electric signals between said first power terminal and said second power terminal; and
    said structure further including a Schottky diode, including:
        an anode;
        a cathode including said substrate; and
        a Schottky barrier between said cathode and said anode, said Schottky barrier being situated between said substrate and an anode layer in the stack of layers.

2. A monolithic semiconductor structure as claimed in claim 1, including a conducting path between the anode and said first power source.

3. A monolithic semiconductor structure as claimed in claim 1, including a recess through the first layer and/or the second layer and wherein said cathode is at least partially formed by a part of said recess filled with a cathode semiconductor material.

4. A monolithic semiconductor structure as claimed in claim 3, wherein said first semiconductor material is an epitaxial material and said recess is filled with an epitaxial regrowth material.

5. A monolithic semiconductor structure as claimed in claim 3, wherein said recess extends from a substrate side of said first layer through the first layer and the second layer, and wherein said recess is filled with a cathode III-nitride material.

6. A monolithic semiconductor structure as claimed in claim 1, wherein said cathode III-nitride material is doped GaN.

7. A monolithic semiconductor structure as claimed in claim 5, wherein said cathode III-nitride material has a higher doping concentration in a part of the recess adjacent to the substrate side than in a part of the recess adjacent to the anode.

8. A monolithic semiconductor structure as claimed in claim 1, including an insulating region between said Schottky diode and said body which electrically separates an aread in which said Schottky diode is situated from said body.

9. A monolithic semiconductor structure as claimed in claim 1, wherein said substrate is Ohmic.

10. A monolithic semiconductor structure as claimed in claim 1, wherein said field effect transistor is a hetero-structure field effect transistor and said body includes a heterojunction structure between said first power terminal and said second power terminal, said hetero-junction structure including an interface at which said first layer and said second layer are in contact with each other and along which interface, when in operation, a two dimensional electron gas is formed.

11. A monolithic semiconductor structure as claimed in claim 1, wherein said first semiconductor material has a different band-gap than said second semiconductor material.

12. A monolithic semiconductor structure as claimed in claim 1, including at least one intermediate layer, such as a transition layer and/or a nucleation layer, between the first layer and the substrate.

13. A monolithic semiconductor structure as claimed in claim 1, wherein said first semiconductor and/or said second semiconductor material are a III-nitride material selected from the group consisting of: III-nitride material, binary III-nitride material, ternary III-nitride material, quaternary III-nitride material, GaN, AlGaN, InGaN; AlInN.

14. A monolithic semiconductor structure as claimed in claim 1, wherein said first semiconductor material is not intentionally doped GaN and/said second semiconductor material is a material containing AlGaN.

15. A monolithic semiconductor structure as claimed in claim 1, wherein said first layer has a thickness of at least 5 micrometers, such as 6 micrometers.

16. A monolithic semiconductor structure as claimed in claim 1, wherein said substrate semiconductor material includes one or more materials of the group consisting of: SiC, doped or undoped Si, epitaxial grown material, crystalline material, poly-crystalline material.

17. An integrated circuit including at least one monolithic semiconductor structure as claimed in claim 1 and additional electronic components connected to the monolithic semiconductor structure to form an electronic circuit.

18. A method for manufacturing a monolithic semiconductor structure, including:
   providing a stack of layers including:
      a substrate;
      a first layer made from a first semiconductor material; and
      a second layer made from a second semiconductor material, said first layer being situated between the substrate and the second layer and at least one of said first semiconductor material and said second semiconductor material containing a III-nitride material; and
   providing a power transistor, including:
      forming a body in said stack of layers;
      forming a first power terminal at a side of said first layer facing said second layer;
      forming a second power terminal in said substrate;
      forming a gate structure for controlling the propagation through said body of electric signals between said first power terminal and said second power terminal; and
   providing a vertical Schottky diode, including:
      forming an anode;
      forming a cathode including said substrate; and
   forming a Schottky barrier between said cathode and said anode, said Schottky barrier being situated between said substrate and an anode layer in said stack of layers.

* * * * *